United States Patent [19]
Henty

[11] Patent Number: 5,838,138
[45] Date of Patent: Nov. 17, 1998

[54] ELECTRONIC DEVICE WHICH IS POWERED BY ACTUATION OF MANUAL INPUTS

[76] Inventor: David L. Henty, 1232 Polaris Dr., Newport Beach, Calif. 92660

[21] Appl. No.: 237,254

[22] Filed: May 2, 1994

[51] Int. Cl.⁶ .................................................. H01M 10/44
[52] U.S. Cl. ........................... 320/107; 320/123; 320/135
[58] Field of Search ................................. 310/389; 320/2, 320/61, 59, 107, 123, 135

[56] References Cited

U.S. PATENT DOCUMENTS

| | | | |
|---|---|---|---|
| 3,559,027 | 1/1971 | Arsem | 320/61 |
| 4,185,621 | 1/1980 | Morrow | 128/672 |
| 4,239,974 | 12/1980 | Swander et al. | 290/1 R |
| 4,320,477 | 3/1982 | Baumgartner | 368/64 |
| 4,360,860 | 11/1982 | Johnson et al. | 362/192 |
| 4,504,761 | 3/1985 | Triplett | 310/800 |
| 4,523,261 | 6/1985 | West | 362/192 |
| 4,701,835 | 10/1987 | Campagnuoo et al. | 362/192 |
| 4,943,752 | 7/1990 | Todd et al. | 310/339 |
| 5,039,928 | 8/1991 | Nishi et al. | 320/2 |
| 5,065,067 | 11/1991 | Todd et al. | 310/339 |

FOREIGN PATENT DOCUMENTS

| | | | |
|---|---|---|---|
| 1-114334 | 5/1989 | Japan | 320/61 |
| 4-127845 | 4/1992 | Japan | 320/61 |
| 4-197041 | 7/1992 | Japan | 320/61 |
| 7-225649 | 8/1995 | Japan . | |

Primary Examiner—Robert Nappi

[57] ABSTRACT

A power regeneration system for a portable electronic device employs a mechanical energy converter for converting mechanical energy generated by activating keys in the keyboard and other manual operators employed in the portable computer into electrical energy. The mechanically generated electrical energy is used to power a transmitter or to recharge a rechargeable battery in the portable computer through a charging circuit. Time between charges of the rechargeable battery from external AC sources is extended due to the recapture of the mechanical energy generated through normal operation of the portable computer.

20 Claims, 6 Drawing Sheets

ELECTRONIC DEVICE WHICH IS POWERED BY ACTUATION OF MANUAL INPUTS

BACKGROUND OF THE INVENTION

1. Field of the Invention

The present invention relates to portable electronic devices including remote control devices, video games and portable computers and power supplies therefor.

2. Background of the Art and Related Information

Portable computers, including laptop computers, notebook computers, and subnotebook computers have become increasingly important and popular business tools. All such computers are battery powered and have significant limitations due to the reliance on battery power. These limitations have not changed significantly despite dramatic advances in all other aspects of portable computing. Although virtually all the power of a desktop computer may now be taken on the road, it is still subject to battery recharging or replacement at a very inconvenient frequency. Depending on whether the portable computer has a hard disk drive, power intensive display or other power intensive component, the lifetime between recharge or replacement of batteries may be as little as 4 hours or less.

Due to the slow pace of improvements in battery design, most attempts to extend battery lifetime in portable computers have focused on improving the efficiency of the computer components. Thus, microprocessors have been developed which are designed for portable computer applications and which have reduced power modes of operation when commands are not being executed. Also, disk drives have been designed with reduced power modes of operation. For example, the disk drive spindle motor may be turned off after an extended period of inactivity to save power. Nonetheless, such computer hardware modifications have failed to significantly ameliorate the problems associated with short battery lifetimes and battery recharging or replacement is still necessary at undesirably frequent intervals.

Accordingly, it will be appreciated that a need presently exists for a means for increasing the time between battery recharge or replacement in portable computers. It will further be appreciated that such a battery lifetime increase should preferably be provided without adding significant weight or cost to the portable computer.

SUMMARY OF THE INVENTION

The present invention provides a portable electronic device having manual input devices, such as push buttons or a keyboard, which is powered by actuation of the input devices by converting mechanical energy from the activation of the input devices into electrical energy.

One embodiment of the present invention provides a battery regeneration system for a portable computer which allows battery lifetime to be extended without requiring new battery technology or redesign of the basic computer hardware. Further, the present invention provides increased battery lifetime without significantly increasing the size, weight, cost or manufacturing complexity of the portable computer.

The present invention provides such enhanced battery lifetime by regenerating a rechargeable battery by capturing mechanical energy present in the portable computer, converting it to electrical energy and employing the recaptured energy to recharge the battery. In a preferred embodiment, mechanical energy generated by manipulation of the computer keyboard during data and command entry by the operator, or manipulation of other data entry or control mechanisms, is converted to electrical energy. This converted mechanical energy is used to charge a rechargeable battery on the portable computer.

In the case of keyboard mechanical energy recapture, electrical pulses may be generated by attaching a magnet to each key and providing a coil of wire encircling each key. Activation of each key thus causes an induced electrical current in the associated coil, with each key acting like a miniature electrical generator. The coils are connected together and to a battery recharging circuit. The battery recharging circuit controls the application of recharging current to the rechargeable battery and prevents discharge through the generator coils. Other well known forms of mechanical to electrical conversion may also be employed. Also, in the case other data entry or control devices, such as a mouse, appropriate mechanical to electrical conversion techniques may be employed.

Accordingly, it will be appreciated that the present invention exploits otherwise wasted mechanical energy in a portable computer to recharge the computer battery. It will further be appreciated that the present invention provides enhanced battery lifetime without introducing costly, bulky or complex added components to the portable computer. Further features and advantages of the present invention will be appreciated by review of the following detailed description of the invention.

DETAILED DESCRIPTION OF THE INVENTION

Figure 1A:
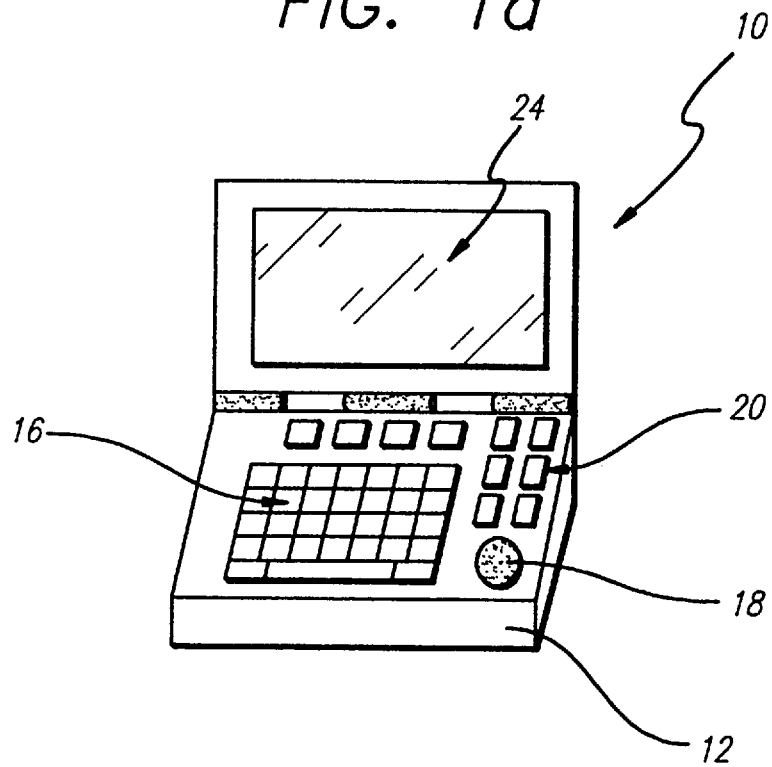
FIG. 1(a) is a perspective view and FIG. 1(b) is an electrical block schematic drawing of a portable computer employing the battery regeneration system of the present invention.
Figure 1B:
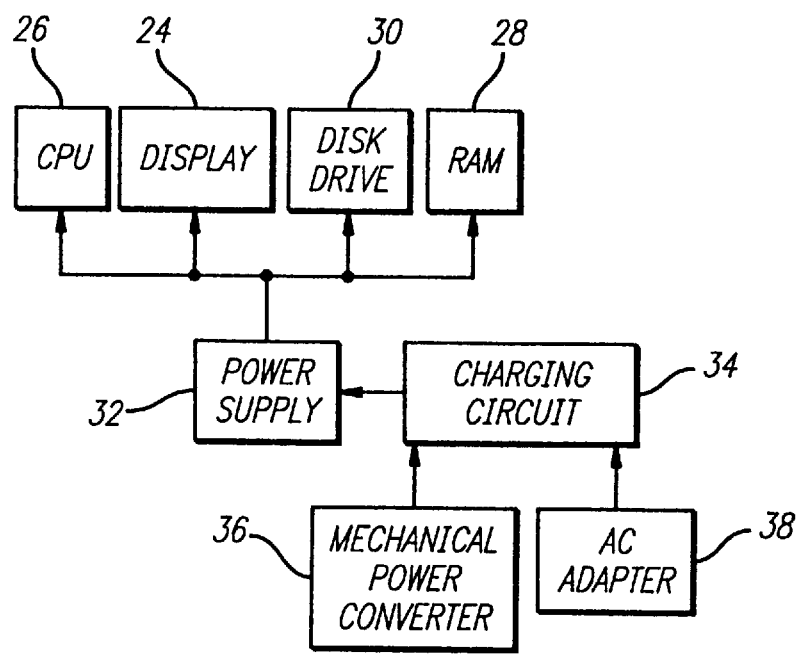

Referring to Figures 1(a) and 1(b), a portable computer incorporating a power regeneration system in accordance with the present invention is illustrated.

As illustrated, portable computer 10 includes a base 12 and cover 14 with a keyboard 16 configured in base 12. Also configured in base 12 are additional manual operators for data input or control indicated by numerals 18 and 20. For example, manual controller 18 may be a built in mouse. Input/controllers 18,20 may include a variety of known function keys as well as operators, including mouse substitutes, game controllers, joysticks, etc. Therefore, these input/controllers are merely illustrated schematically in Figure 1(a) as buttons and may include such other input or control devices and may include a greater or lesser number than that illustrated. Cover 14 in turn may conventionally house display 24.

Referring to FIG. 1(b), the electronic components of computer 10 are illustrated. As shown these include the Central Processor Unit (CPU) 26 which may be any of a number of commercially available microprocessors such as those manufactured by Intel, Motorola, and Advanced Micro Devices. Further CPU 26 may be adapted for portable computer applications by having reduced power modes, such as provided by the Intel SL series of microprocessors currently including the 386SL and 486SL microprocessors. The electronic components also include RAM 28, nonvolatile memory 30, which may be a hard disk drive or memory card, and display 24.

As further shown in Figure 1(b), a power supply 32 is provided, which may be a conventional rechargeable battery and voltage regulator. For example, a rechargeable NiCad battery may be employed along with a regulator to provide a stable voltage supply. As discussed below, power supply 32 may also be a combination of a rechargeable battery and a nonrechargeable but replaceable battery, such as an alkaline battery, or may be a pair of rechargeable batteries. It will of course be appreciated that additional batteries, both of the rechargeable and nonrechargeable type and combinations thereof to form battery packs as desired for the specific portable computer application, may be employed. At least one rechargeable battery is required, however.

Also shown in FIG. 1(b) is a battery charging circuit 34. As shown, the charging circuit 34 is coupled to a standard AC adapter 36. This may be adapted to allow recharge of the one or more rechargeable batteries in power supply 34 from a standard AC outlet in a conventional manner. As also shown, the battery charging circuit is also coupled to a mechanical power converter 38. As illustrated schematically, the mechanical power converter 38 is coupled to the manual operators on keyboard 10. As discussed in more detail below, the mechanical power converter 38 converts the mechanical energy generated by the activation of the keys of the keyboard 10, as well as the other manual data input devices and controllers, to electrical current which is used by battery charging circuit 34 to recharge the rechargeable battery in power supply 32.

Figure 2A:
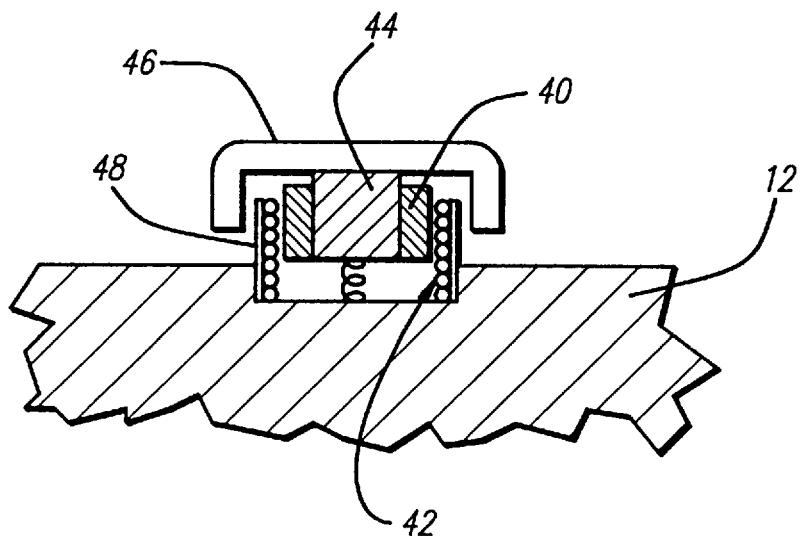
FIGS. 2 (a) and 2 (b) are cross-sections through portions of the keyboard of the portable computer of FIG. 1 showing a magnet and coil type energy converter for two types of manual operators in accordance with a preferred embodiment of the present invention.
Figure 2B:
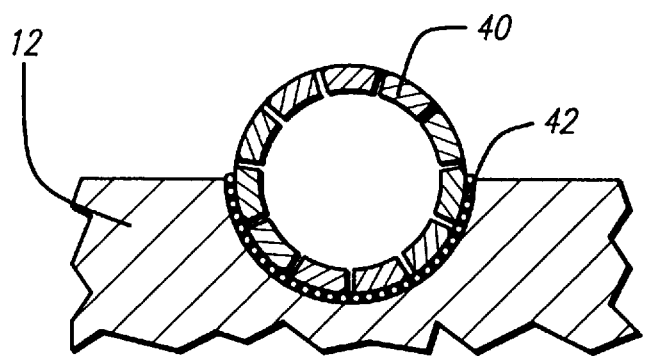
Figure 3:
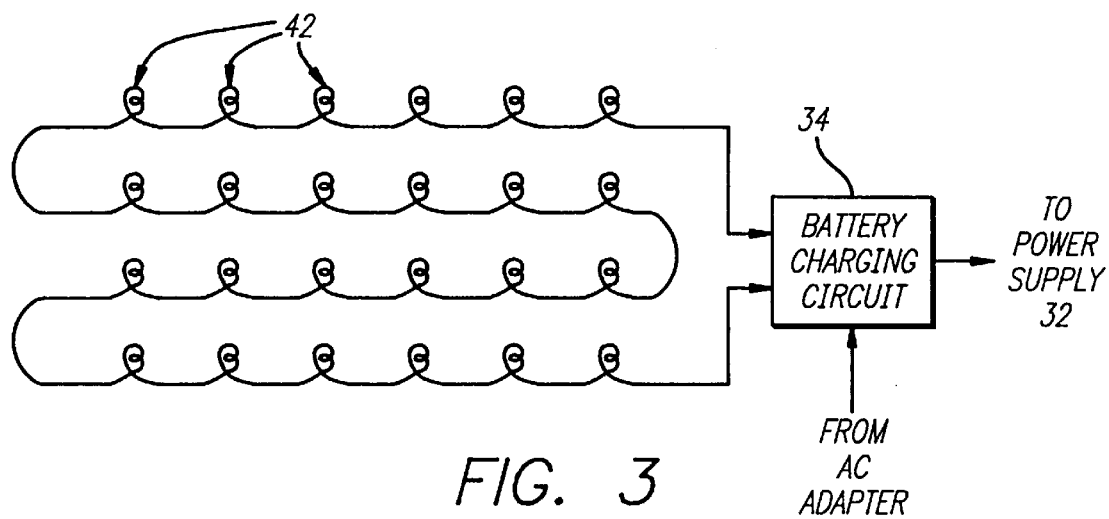
FIG. 3 is a schematic drawing illustrating a plurality of keyboard electrical generating coils coupled to a battery recharging circuit in accordance with a preferred embodiment of the present invention.

Referring to FIGS. 2(a), 2(b) and 3, a preferred embodiment of the mechanical power converter 38 is illustrated in more detail. As shown in FIG. 2(a), each key in keyboard 16, as well as any push-button style ones of operators 18,20, may preferably be provided with a current generator including a permanent magnet 40 and a coil of wire 42. The key or manual operator may have a central body portion 44, to which the permanent magnet 40 is attached, and an upper portion 46 which is contacted by the fingers of the operator during activation of the key or manual operator. Permanent magnet 40 may be a thin high strength magnet which is adhesively attached or otherwise securely mounted to the key or operator underneath upper portion 46. Alternatively, body portion 44 may be the permanent magnet. Also, two or more thin magnets may be employed attached to the outside of body portion 44. Wire coil 42 may be mounted to a mandrel 48 which is attached to the keyboard. The wire coil 42 is independent of the electrical connection for the data input from the key or operator, which may be completely conventional in nature and is not shown.

In the case of a rotational operator, such as a mouse, a rotational current generator with one or more permanent magnets 40 on the inside of the ball portion of the mouse may be employed. This is illustrated in FIG. 2(b).

As illustrated in FIG. 3, the wire coils 42 for the keys and operators on the keyboard are preferably electrically connected together in series and coupled to battery charging circuit 34. This is illustrated schematically in FIG. 3 for a subset of the total number of keys and operators which would typically be present on the keyboard of a portable computer, for convenience of illustration. Although the series connection of the wire coils 42 is economical in added wiring, it adds resistance to the circuit for any given key and therefore a parallel connection may alternatively be employed. In such a parallel connection the initial activation of a key or operator may also close a switch in the wire coil array connecting the associated coil to the battery charging circuit 34. The simple series electrical circuit illustrated in FIG. 3 is thus replaced with an electrical matrix.

As further shown in FIG. 3, the wire coil array forming mechanical power converter 38 is coupled to battery charging circuit 34 which in turn is coupled to power supply 32, which as noted above includes one or more batteries, at least one of which is rechargeable. Also, as discussed, battery charging circuit 34 may receive an AC recharging power supply provided from a conventional AC outlet via an adapter including a transformer.

Figure 4:
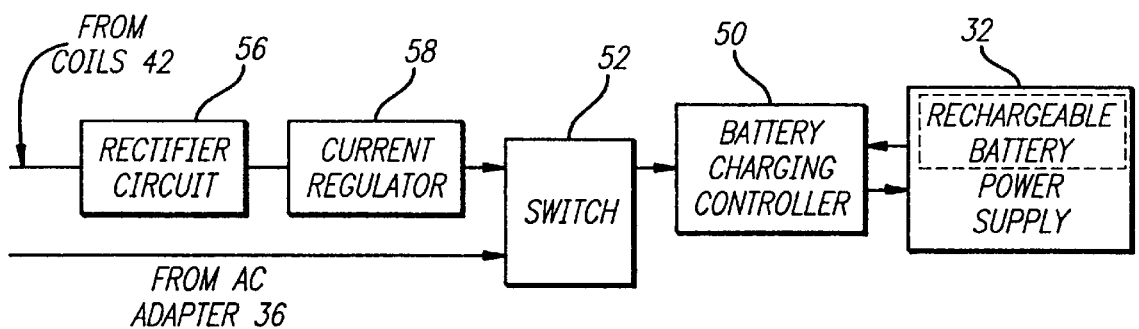
FIG. 4 is a block schematic drawing illustrating the battery charging circuit of FIG. 3.

Referring to FIG. 4, battery recharging circuit 34 is illustrated in block schematic form. As shown, the battery recharging circuit may include charging controller circuit 50, which controller may also be adapted to recharge the battery from an AC outlet. Suitable controllers for ensuring maximal charging of a rechargeable battery are described in the art, e.g., in U.S. Pat. No. 5,187,425, issued Feb. 16, 1993 the disclosure of which is incorporated herein by reference. A switch 52 may selectively couple this charging controller circuit 50 to the AC adapter 36 and decouple the mechanical power converter 38 therefrom during conventional wall outlet battery recharging. The mechanical power converter 38 in turn is coupled to the controller 50 via switch 52 when the adapter is not coupled to an external power source and the voltage on line 54 is low and the computer is on.

Since the current generated by mechanical power converter 38 is pulsed in nature, the charging circuit 34 preferably includes means for smoothing the current pulses provided from mechanical power converter 38 as well as means for rectifying the current provided from the key stroke operated generator illustrated in FIG. 2. Thus, as illustrated in FIG. 4, the charging circuit 34 includes a rectifier circuit 56 and current regulator 58. Rectifier circuit 56 in combination with the current regulator circuit 58 takes a pulsed AC current provided from a coil type mechanical power converter, such as illustrated in FIGS. 2 and 3, and provides a smooth substantially constant DC current through switch 52 and charging controller 50 to the rechargeable battery in power source 32. Current regulator 58 may preferably include means for accumulating and temporarily storing current, for example, including a capacitor, so that pulses occurring at about 1 second intervals may nonetheless provide a constant charging current. The charging circuit 34 includes a battery charge sense circuit in the charging controller 50 coupled along line 60 to the battery to determine the charge on the battery. Upon the battery being fully charged either by application of charging current from AC exterior source or from the mechanical power converter the battery charge sense circuit will provide an indication to prevent overcharging of the rechargeable battery.

It should be appreciated that the charging circuit illustrated in FIG. 4 may be varied in many ways while providing the desired charging current to the power source 32 from the mechanical power converter 38.

Figure 5:
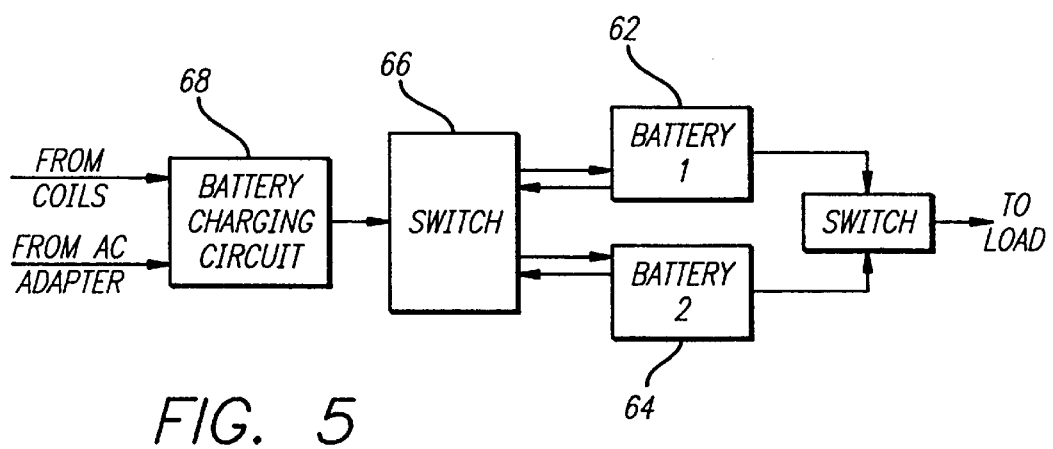
FIG. 5 is a schematic drawing of an alternate embodiment of the present invention employing dual rechargeable batteries.

Referring to FIG. 5, an alternate embodiment is illustrated where first and second batteries 62, 64 are employed with at least one of them being a rechargeable battery, along with a selection circuit 66 to selectively couple the battery charging circuit 68 to one of the two batteries. The embodiment of FIG. 5 may be advantageously employed to maximize the charging of two (or more) rechargeable batteries. For example, if two rechargeable batteries are employed for batteries 62 and 64, the embodiment of FIG. 5 will preferably allow the portable computer to be operated from one of the rechargeable batteries while the other is being recharged to a maximum charge. The partially depleted rechargeable battery is continuously employed until substantially totally discharged, the optimal point for recharging for maximum battery lifetime. At this time the operation of the portable computer is switched to the other recharged battery. At this time the recharging of the first battery is commenced from the mechanical power converter 38. Alternatively, to maximize the utilization of the mechanically generated energy, charging may be switched immediately after the other battery is fully charged. Therefore, selection circuit 66 receives a voltage and/or temperature feedback signal from both batteries 62,64 to determine the appropriate switch time. Also, it should be appreciated that selection circuit 66 may be incorporated in charging circuit 68, for example, being programmed into the functions of the controller corresponding to controller 50 described above. Alternatively, a nonrechargeable battery, such as an alkaline battery or battery pack, may be employed for one of the two batteries relying upon the nonrechargeable battery during such recharging.

The charging circuitry described above may be substantially employed for circuit 68 illustrated in FIG. 5. As further disclosed in the above noted 425 patent, selective switching between a trickle charge mode and a fast charge mode maybe be provided and such feature may also be advantageously exploited in the present invention wherein the rechargeable battery or batteries may be maintained in a substantially fully charged mode as long as the mechanical power converter 38 provides adequate charging current.

Figure 6A:
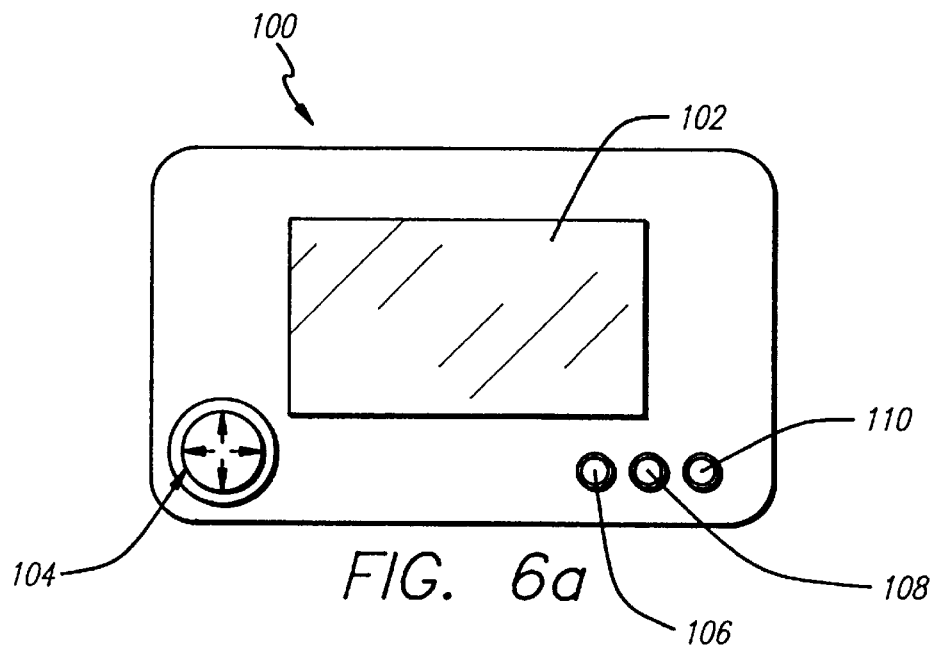
FIG. 6(a) is a top view and FIG. 6(b) is an electrical schematic drawing of a portable video game employing a battery regeneration system in accordance with an alternate embodiment of the present invention.
Figure 6B:
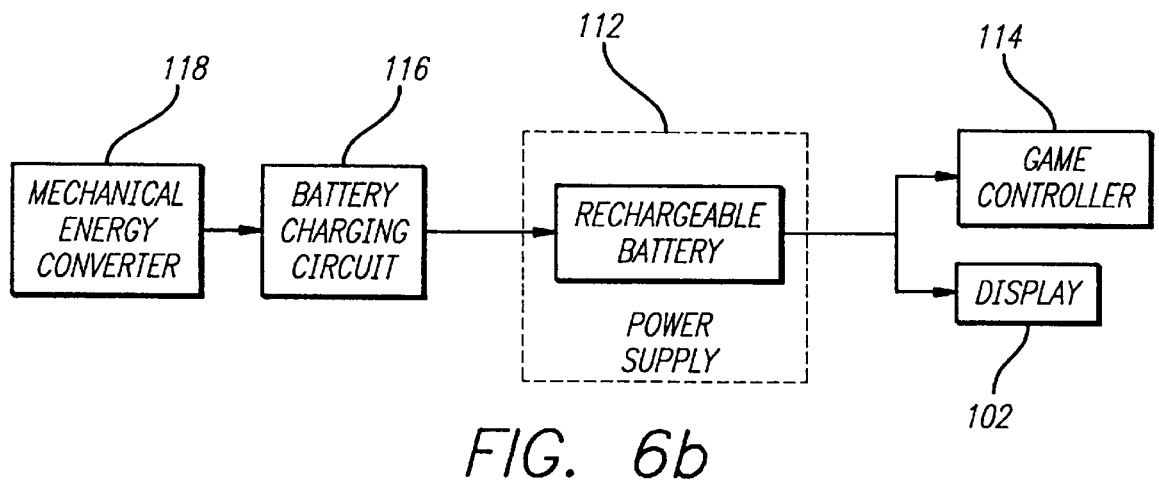

Referring to FIGS. 6(a) and 6(b) an alternate embodiment of the present invention is illustrated. As illustrated, a portable video game 100 includes a display screen 102, a multi-directional controller 104, and additional control buttons 106, 108, 110. These additional control buttons may include a power button, a "fire" button, and other game control function(s). Additional or fewer such buttons may be employed and controls other than buttons, for example a joystick, may also be employed. The video game also includes a battery power supply 112 which is preferably of a rechargeable type. Alternatively, power supply 112 may include a separate rechargeable battery which may be provided, for example, as an add on battery pack. Power supply 112 provides power to a game controller 114, which includes the processor and software to control the video game, and to display 102.

As further shown in FIG. 6(b), power supply 112 receives a recharging current from battery charging circuit 116 and mechanical power converter 118. Battery charging circuit 116 may be the same as the circuit described above in relation to FIG. 4, and may optionally include a means for recharging from an external AC power supply such as also illustrated in FIG. 4. Mechanical power converter 118 in turn may be as described above in relation to FIG. 2(a) for push button type operators, e.g., operators 106,108,110 illustrated in FIG. 6(a). For multi-directional operators such as illustrated by operator 104 in FIG. 6(a), mechanical power converter 118 may be implemented as illustrated in FIG. 7.

Figure 7:
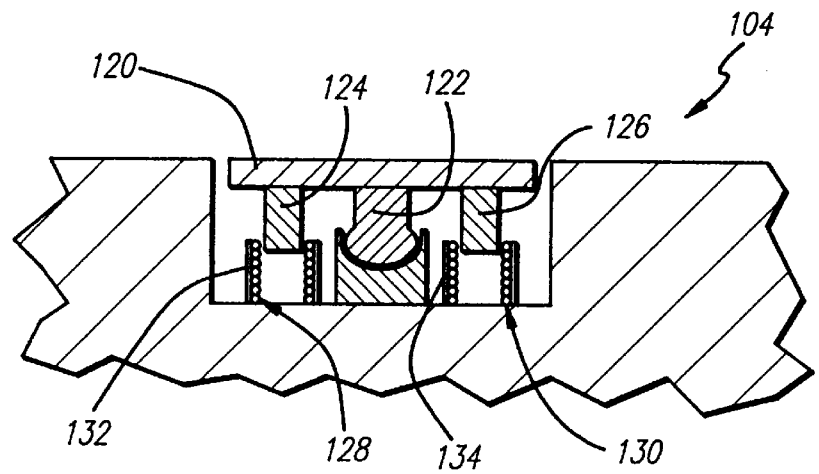
FIG. 7 is a cross-section through a portion of the video game housing showing a magnet and coil arrangement on the game controller.

Referring to FIG. 7, the multi-directional controller 104 is illustrated in a cross-sectional view. The illustrated game controller has a "rocker" configuration allowing pivoting about a central axis in various directions. It should be appreciated that the illustrated controller design is only one of a variety of possible designs and the mechanical power conversion system illustrated may be modified for such alternate controller designs. For example in a joystick design the up and down mechanical movement becomes more of a lateral motion with joystick activation and the mechanical power conversion system may be readily modified from that illustrated in FIG. 7 by rotating the magnet/coil arrangement shown from a horizontal to a vertical plane.

As shown in FIG. 7, the rocker type controller 104 includes a contact member 120 which has a generally planar upper surface which pivots about a central rocker arm 122. The rocker arm 122 is pivotably mounted to the housing in any suitable manner capable of withstanding extended use. Mounted to the bottom surface of contact member 120 are permanent magnets, preferably at least four in number, two of which 124,126 are shown in FIG. 7. These permanent magnets are positioned over corresponding wire coils, two of which 128,130 are illustrated in FIG. 7. These wire coils are preferably wound on mandrels 132,134 which are in turn mounted to the housing. The wire coils are electrically coupled together, in an electrical series or parallel configuration, and connected to the battery charging circuit 116 as illustrated in FIG. 6(b).

Figure 8A:
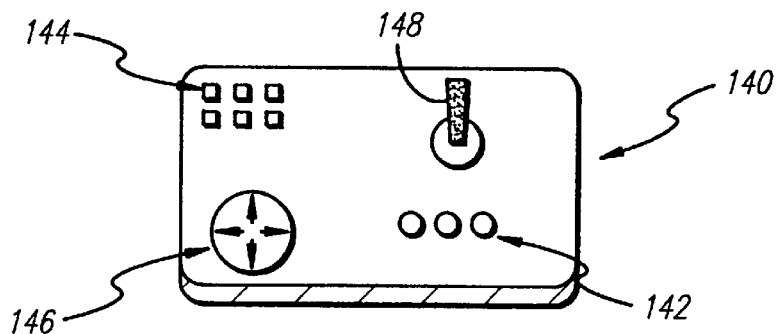
FIG. 8(a) is a top view and FIGS. 8(b) and 8(c) are electrical schematic drawings of a video game or interactive multimedia remote controller employing a mechanical to electrical energy conversion system in accordance with another embodiment of the present invention.

Referring to FIGS. 8(a), (b) and (c), an alternate embodiment of the present invention is illustrated implemented in a wireless remote controller for a video game, interactive multi-media system,or other type of interactive home entertainment system.

Referring to FIG. 8(a), the remote controller 140 includes a number of push button type controls illustrated generally by first group of controls 142 and second group 144. In a game controller application or an interactive multi-media application these push button controls 142 may typically include the controls discussed above in relation to the embodiment of FIG. 6(a). The second group of controls 144 may include programming or channel selection controls. Remote controller 140 also includes one or more multi-directional controllers, shown as a rocker type controller 146 and a joystick controller 148. Associated with each mechanical controller is a mechanical power converter. More specifically, push button controllers 142,144 have mechanical power converters preferably of the type shown in FIG. 2(a) associated therewith. Multi-directional controller 146 in turn preferably has a mechanical energy converter of the type illustrated in FIG. 7 associated therewith whereas the controller 148 may employ a similar converter with the coil/magnets rotated through 90 degrees.

Figure 8B:
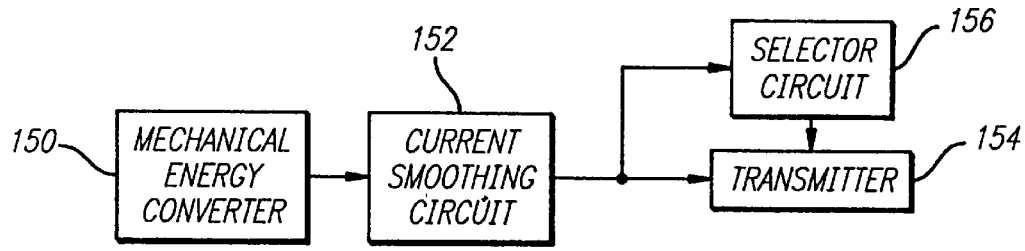

Referring to FIG. 8(b), a preferred embodiment of the control and power circuitry of the remote controller are illustrated. In the very simple illustrated implementation the mechanical power converters 150 are coupled to a current smoothing circuit 152 which smooths the current pulse from the converters, e.g. through a capacitor and current regulator, and provides an extended duration pulse of regulated current to transmitter 154. Transmitter 154 may employ an LED array or RF transmitter. The regulated current pulse is also provided to selecter circuit 156 which determines which control was activated and selects the appropriate frequency for transmitter 154 to send to the remote system being controlled.

Alternatively, the power conversion circuitry may be combined with the control circuitry such that selecter circuit 156 is dispensed with and the specific power converter energized by activation of the associated control also provides the control information to transmitter 154, either by energizing a specific LED or combination of LEDs directly coupled thereto, or by energizing a decoder circuit forming part of transmitter 154. It will be appreciated that in this latter implementation the power converters 150 will be connected in a parallel configuration with both current regulator 152 and transmitter 154 as illustrated in FIG. 8(c).

Figure 8C:
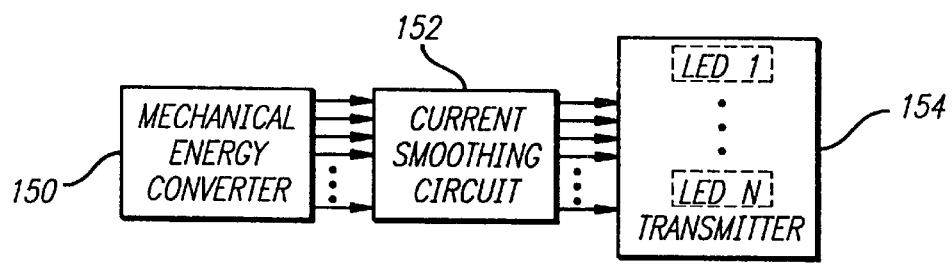

Since the remote controller illustrated in FIGS. 8(a), 8(b) and 8(c) only provides control information to a remote system, which control information only corresponds to activation of a control, every such action may be associated with an adequate current pulse to power the remote controller. In the appropriate case the provision of a separate battery power supply may thus be dispensed with and the remote controller operated exclusively from mechanically converted power. However, where extended sustain type control is desired or where a volatile memory is desired to store programming information, etc., a separate battery power supply may be provided. This battery may be of a rechargeable type in which case the mechanical power converters may be employed to recharge the battery as in the prior described embodiments.

Figure 9:
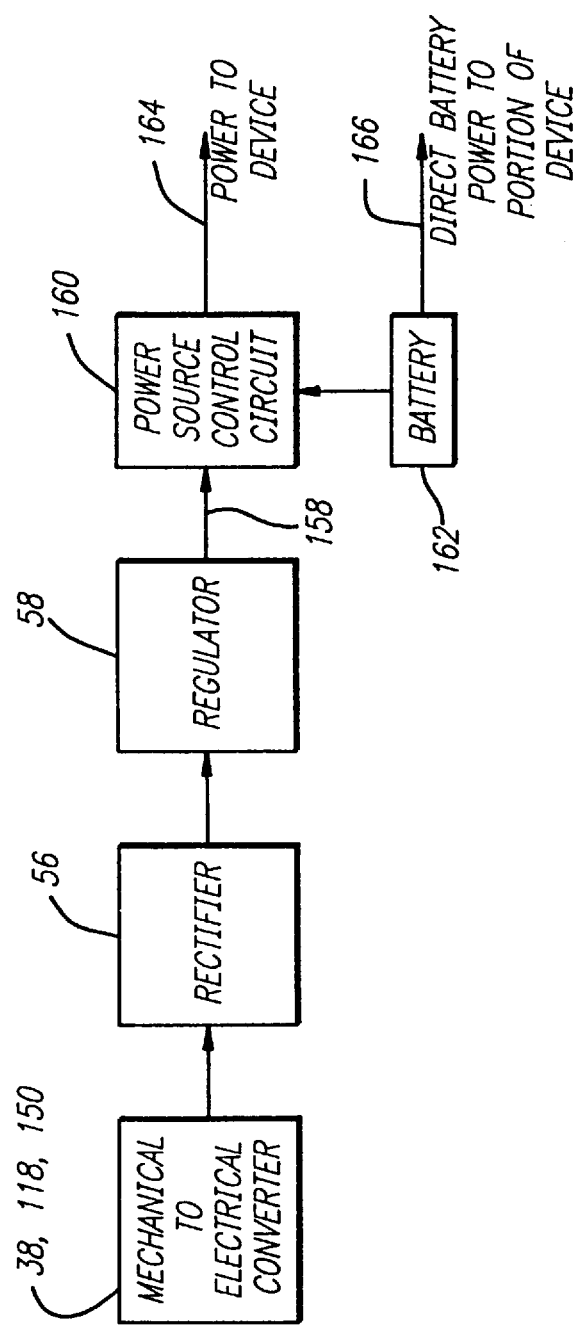
FIG. 9 is a block schematic drawing of an alternate embodiment of the present invention adapted for extending the lifetime of a nonrechargeable battery.

Referring to FIG. 9 a block schematic drawing of a circuit which may be employed to extend battery lifetime of a nonrechargeable battery is illustrated. The circuit of FIG. 9 may be employed in any of the above-described embodiments where a nonrechargeable battery is employed. Thus, as illustrated, any of mechanical to electrical power converters 38,118,150 described above may be employed to provide an additional power supply to a battery powered device. The current from the converter is provided to rectifying and smoothing circuits 56,58 of the type described above. The output from these circuits is supplied along line 158 to power source control circuit 160 which is also coupled to a nonrechargeable battery 162. Power source control circuit 160 senses the voltage on line 158 and when it exceeds a threshold level supplies power from line 158 to the device along line 164. When the voltage is below the threshold the power source control circuit 160 supplies power from battery 162 to the device along line 164. Thus, when sufficient power is available from the mechanical to electrical power converters the battery is decoupled thereby extending battery lifetime.

As further shown in FIG. 9, an optional direct connection of battery 162 to a portion of the device electronics may be provided along line 166. Such a direct connection may be employed in some applications; for example, in a video game or remote controller such as described above the battery 162 could be directly coupled to a display while control and/or transmit functions are powered by converters 38,118,150. Further, in certain applications, such as a remote controller, it may be possible to dispense with power source control circuit 160 and couple converters 38,118,150 to a portion of the device, such as control and transmit electronics, and couple the battery 162 to the remainder of the device.

It will be appreciated that the foregoing description of the present invention is of a presently preferred embodiment and is not to be taken in a limiting sense. A variety of modifications may be made in the described embodiments. For example, while the mechanical power converter is illustrated for use with a keyboard having a plurality of keys and mechanical operators thereon, and has been described in terms of a magnet/coil arrangement, it should be appreciated that other means for converting the mechanical energy of the keys or operators into electrical energy may be employed. Such alternate means may include piezoelectric elements, capacitive/electrostatic elements, etc. Also, for the embodiment illustrating coil and magnet mechanical power conversion, while the magnet has been illustrated attached to the key and movable through a fixed coil of wire, it should be appreciated that the configuration may be reversed with the coil being attached to the keys and movable through or about associated fixed permanent magnets. Also, a portion of the coil may be fixed, and a portion moveable, so that the coil area and the flux through the coil changes with the mechanical movement to generate current. Also, it should be appreciated that the present invention may be employed in other battery operated devices having moveable operators than those illustrated. For example, the present invention could be employed with a portable keyboard type electronic musical instrument with the keys thereof being coupled to mechanical energy converters of the type described above and such converters coupled to a battery recharging circuit and rechargeable battery and/or directly to a tone generator. Also, a remote controller for a personal computer, such as a remote control mouse, may advantageously employ the present invention.

A variety of additional modifications and alternate implementations are also possible. Therefore, the illustrated embodiment should not be viewed as limiting in any sense but merely as illustrative in nature.

What is claimed is:

1. A portable computer power supply system for use with a portable computer having a keyboard, and a plurality of keys therein, a CPU, a memory and a display, comprising:
   a rechargeable battery;
   means, coupled to the keys in the keyboard, for converting mechanical energy due to activation of the keys by an operator into electrical energy; and
   a charging circuit, coupled between the means for mechanically generating electrical energy and said rechargeable battery, and supplying charging current to said rechargeable battery.

2. A power supply for a portable computer as set out in claim 1, wherein said means for converting mechanical energy into electrical energy comprises a plurality of permanent magnets coupled to respective keys on the key board and a matching plurality of coils configured so as to receive the respective permanent magnets therethrough upon activation of the keys of the keyboard.

3. A power supply as set out in claim 1, wherein said charging circuit comprises a current regulator and a rectifier.

4. A power supply as set out in claim 2, wherein said coils of wire are electrically connected in series.

5. A power supply as set out in claim 1, wherein said charging circuit includes means for selectively coupling charging current to the battery from said means for mechanically generating or an outside source.

6. A power supply as set out in claim 1, wherein said portable computer includes a mouse and wherein said means for mechanically generating electrical energy converts the rotational energy of said mouse into electrical current.

7. A power supply as set out in claim 1, further comprising a second rechargeable battery and means for selectively coupling the charging circuit to said rechargeable battery or said second rechargeable battery depending upon the state of charge of said rechargeable batteries.

8. A portable computer comprising:
   a keyboard including a plurality of manual operators, said manual operators including a plurality of keys, adapted to be activated by an operator of the portable computer;
   a central processor unit (CPU);
   a display;
   a memory;
   a rechargeable battery for supplying power to said CPU, display and memory;
   an electrical energy generator coupled to said manual operators of the keyboard of the portable computer and providing electrical energy generated from the mechanical energy provided by activation of the manual operators; and
   a battery charging circuit coupled to said electrical energy generator and the rechargeable battery so as to supply electrical energy generated by said generator to the rechargeable battery.

9. A portable computer as set out in claim 8, wherein the generator comprises a plurality of permanent magnets attached to the respective manual operators and a plurality of wire coils adapted to receive the permanent magnets therethrough upon activation of the corresponding manual operator.

10. A video game, comprising:
    a plurality of manual controllers for controlling said video game;
    means, associated with each of said manual controllers, for converting mechanical energy due to activation of said controllers to electrical energy;
    a rechargeable battery for supplying power to said video game; and
    a recharging circuit for recharging said rechargeable battery from the electrical energy provided from said mechanical energy converting means.

11. A remote controller comprising:
    a plurality of input devices movable in response to manual operation thereof;
    a plurality of mechanical to electrical energy converters, each associated with one of said input devices; and
    a transmitter, coupled to the mechanical to electrical energy converters so as to receive power therefrom and activated by the input devices so as to transmit a control signal in response to a manual operation thereof.

12. A remote controller as set out in claim 11, wherein said transmitter comprises an RF transmitter.

13. A remote controller as set out in claim 11 wherein said transmitter comprises an LED.

14. A remote controller as set out in claim 11, wherein said transmitter comprises an array of LEDs.

15. A remote controller as set out in claim 11, wherein said input devices comprise a plurality of push buttons.

16. A remote controller as set out in claim 11, wherein one of said input devices comprises a rocker controller.

17. A remote controller as set out in claim 11, wherein one of said input devices comprises a joystick controller.

18. A remote controller as set out in claim 11, wherein one of said input devices comprises a mouse.

19. A remote controller as set out in claim 11, wherein said input devices comprise a plurality of push buttons and wherein the control signal is determined by the specific push button which is activated.

20. A remote controller as set out in claim 19, further comprising selector circuit means, coupled to the push buttons, for determining the control signal in response to push button activation.

* * * * *